(12) United States Patent
Tanaka

(10) Patent No.: US 7,566,880 B2
(45) Date of Patent: Jul. 28, 2009

(54) PHOTO-CONDUCTOR LAYER FOR CONSTITUTING RADIATION IMAGING PANELS

(75) Inventor: Motoyuki Tanaka, Kanagawa-ken (JP)

(73) Assignee: FUJIFILM Corporation, Tokyo (JP)

(*) Notice: Subject to any disclaimer, the term of this patent is extended or adjusted under 35 U.S.C. 154(b) by 374 days.

(21) Appl. No.: 11/375,205

(22) Filed: Mar. 15, 2006

(65) Prior Publication Data

US 2006/0210910 A1    Sep. 21, 2006

(30) Foreign Application Priority Data

Mar. 15, 2005    (JP)    ............... 2005-072954

(51) Int. Cl.
*C09K 11/59* (2006.01)
*C09K 11/66* (2006.01)
*G01T 1/202* (2006.01)

(52) U.S. Cl. ............ 250/370.11; 252/301.4 F
(58) Field of Classification Search .......... 250/580, 250/370.11; 252/301.4 F
See application file for complete search history.

(56) References Cited

U.S. PATENT DOCUMENTS

| 5,571,646 | A * | 11/1996 | Utsumi et al. ............ 430/48 |
| 2008/0047483 | A1* | 2/2008 | Venkataramani et al. ....... 117/8 |

FOREIGN PATENT DOCUMENTS

| EP | 0 075 180 A2 | 3/1983 |
| JP | 11-211832 A | 8/1999 |
| JP | 11-237478 A | 8/1999 |
| JP | 2000-249769 A | 9/2000 |
| JP | 2000249769 A * | 9/2000 |

OTHER PUBLICATIONS

"Crystal Growth and Optical Properties of Large Single-Crystals of Bismuth Silicon Oxide", by K. Tada et al., Transactions of The Chemical Society of Japan, No. 10, pp. 1630-1639, 1981.

"Determination of the Diffusion Length of Charge Carriers in Nonstoichiometric Sillenite-Type Crystals by the Techniques of Nonsteady-State Photocurrents", by H. Vogt and E. Kratzig, Journal of Applied Physics, vol. 94, No. 4, pp. 2507-2509, 2003.

(Continued)

*Primary Examiner*—David P Porta
*Assistant Examiner*—David S Baker
(74) *Attorney, Agent, or Firm*—Sughrue Mion, PLLC

(57) ABSTRACT

A photo-conductor layer for constituting a radiation imaging panel, which photo-conductor layer is capable of recording radiation image information as an electrostatic latent image, contains a polycrystal constituted of $Bi_xMO_y$, in which M represents at least one kind of element selected from the group consisting of Ge, Si, and Ti, x represents a number satisfying the condition $12.05 \leqq x \leqq 13.1$, and y represents a stoichiometric oxygen atom number determined by M and x. The photo-conductor layer has a high sensitivity.

8 Claims, 6 Drawing Sheets

OTHER PUBLICATIONS

M.H. Garrett; "Properties of Photorefractive Nonstoichiometric Bismuth Silicon Oxide, $Bi^xSiO_{1.5x+2}$;" J. Opt. Soc. Am. B.; vol. 8; No. 1; 1991; pp. 78-87; XP002520044.

S.M. Babu et al.; "Interband Transitions in Bismuth Germanate Crystals Grown from the Melts of Several [Ge]/[Bi] Ratios;" J. Opt. Soc. Am. B.; vol. 16; No. 8; 1999; pp. 1243-1249; XP002520045.

S.M. Babu et al.; "Stoichiometry and Doping Induced Modifications in the Properties of $Bi_{12}SiO_{20}$ Single Crystals;" Journal of Crystal Growth, Elsevier, Amsterdam, NL; vol. 275; No. 1-2; Feb. 15, 2005; pp. e681-e686; XP025371868.

* cited by examiner

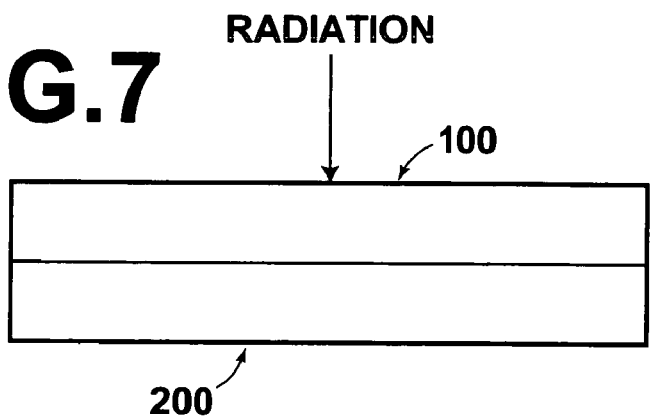
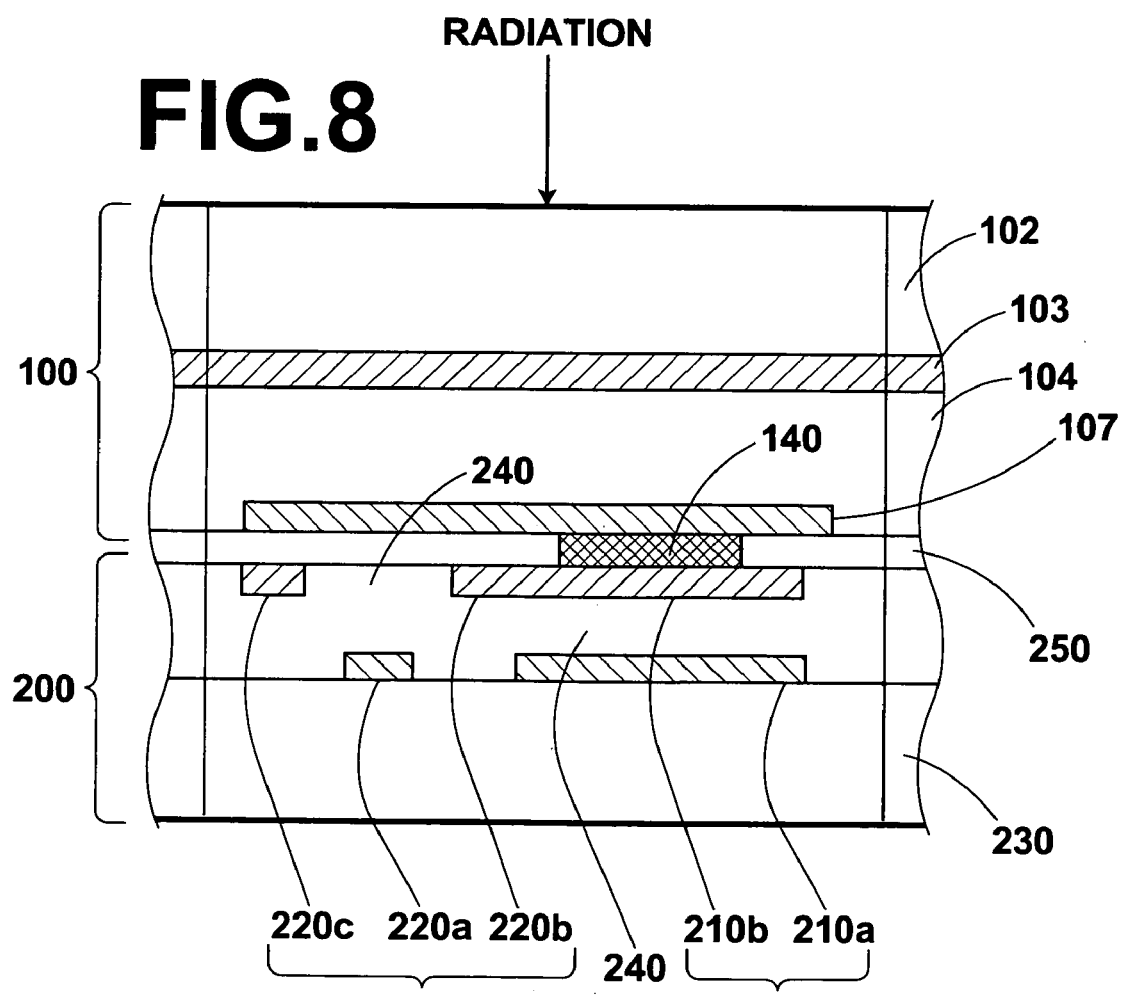

PHOTO-CONDUCTOR LAYER FOR CONSTITUTING RADIATION IMAGING PANELS

BACKGROUND OF THE INVENTION

1. Field of the Invention

This invention relates to a radiation imaging panel adapted for use in a radiation imaging apparatus, such as an X-ray imaging apparatus. This invention particularly relates to a photo-conductor layer for constituting the radiation imaging panel.

2. Description of the Related Art There have heretofore been proposed X-ray imaging panels designed for use in a medical X-ray image recording operation, such that a radiation dose delivered to an object during the medical X-ray image recording operation may be kept small, and such that the image quality of an image and its capability of serving as an effective tool in, particularly the efficient and accurate diagnosis of an illness may be enhanced. With the proposed X-ray imaging panels, a photo-conductor layer sensitive to X-rays is employed as a photosensitive material. The photo-conductor layer is exposed to X-rays carrying X-ray image information, and an electrostatic latent image is thereby formed on the photo-conductor layer. Thereafter, the electrostatic latent image, which has been formed on the photo-conductor layer, is read out by use of light or a plurality of electrodes. The techniques utilizing the X-ray imaging panels have advantages over the known photo-fluorography utilizing TV image pickup tubes in that an image is capable of being obtained with a high resolution.

Specifically, when X-rays are irradiated to a charge forming layer located in the X-ray imaging panel, electric charges corresponding to X-ray energy are formed in the charge forming layer. The thus formed electric charges are read out as an electric signal. The photo-conductor layer described above acts as the charge forming layer.

A material represented by a chemical formula $Bi_{12}MO_{20}$, in which M represents at least one kind of element selected from the group consisting of Ge, Si, and Ti, has photo-conductivity and dielectric characteristics. Therefore, it has heretofore been studied to utilize the $Bi_{12}MO_{20}$ material for constituting the photo-conductor layer described above. By way of example, the use of a $Bi_{12}GeO_{20}$ material or a $Bi_{12}SiO_{20}$ material for constituting the photo-conductor layer is described in, for example, Japanese Unexamined Patent Publication No. 11(1999)-211832. Ordinarily, it has been considered as being optimum that the crystal composition of $Bi_{12}MO_{20}$ be of the stoichiometric ratio. By way of example, $Bi_{12}GeO_{20}$ and $Bi_{12}SiO_{20}$ (i.e., $Bi_xGeO_y$ and $Bi_xSiO_y$, in which x=12, and y=20) are described in, for example, Japanese Unexamined Patent Publication Nos. 11(1999)-237478 and 2000-249769.

Also, in, for example, "Crystal Growth and Optical Properties of Large Single-Crystals of Bismuth Silicon Oxide", by K. Tada et al., Transactions of The Chemical Society of Japan, No. 10, pp. 1630-1639, 1981, it is described that experiments for growing a $Bi_xMO_y$ single crystal were made with a melt composition being altered within the range of $10 \leq x \leq 14$, and that a maximum photo-conduction current was obtained with a single crystal having been grown with a melt of x=11.5 (a crystal composition ratio of the single crystal, as read from a graph: approximately 12.15 and approximately 12.69). Further, in, for example, "Determination of the Diffusion Length of Charge Carriers in Nonstoichiometric Sillenite-Type Crystals by the Technique of Nonsteady-State Photocurrents", by H. Vogt and E. Krätzig, Journal of Applied Physics, Vol. 94, No. 4, pp. 2507-2509, 2003, it is described that experiments for growing a $Bi_xGeO_y$ single crystal were made with a $GeO_2$ content with respect to a melt composition being altered within the range of 9.0 mol % to 20.0 mol % (expressed in terms of x, $9 \leq x \leq 20$), that experiments for growing a $Bi_xSiO_y$ single crystal were made with an $SiO_2$ content with respect to a melt composition being altered within the range of 9.0 mol % to 18.0 mol % (expressed in terms of x, $8 \leq x \leq 20$), and that alterations of μτ (i.e., the product of a carrier mobility and a life) of the thus grown single crystals were investigated.

The inventors conducted extensive research and found that, in contrast with the descriptions made in, for example, Japanese Unexamined Patent Publication Nos. 11(1999)-237478 and 2000-249769, the quantity of generated electric charges becomes large in cases where the proportion of bismuth is higher than the bismuth proportion in the crystal composition having the stoichiometric ratio, which crystal composition is ordinarily considered as being optimum. The present invention is based upon the findings described above. The materials, which are described in, for example, "Crystal Growth and Optical Properties of Large Single-Crystals of Bismuth Silicon Oxide", by K. Tada et al., Transactions of The Chemical Society of Japan, No. 10, pp. 1630-1639, 1981, and "Determination of the Diffusion Length of Charge Carriers in Nonstoichiometric Sillenite-Type Crystals by the Technique of Nonsteady-State Photocurrents", by H. Vogt and E. Krätzig, Journal of Applied Physics, Vol. 94, No. 4, pp. 2507-2509, 2003, are the $Bi_xMO_y$ single crystals. With respect to the $Bi_xMO_y$ single crystals, which have little grain boundary, it is expected that a dark current is capable of being suppressed, and that an X-ray photo-current quantity is capable of being enhanced. However, the $Bi_xMO_y$ single crystals have the drawbacks in that the production cost is not capable of being kept low, and it is not always possible from a technical view point to form a layer having a large area with a size of several tens of centimeters×several tens of centimeters. Therefore, the $Bi_xMO_y$ single crystals are not appropriate for practical use. Further, as for the single crystals, the problems are encountered in that, since it is not easy to control the compositions of the single crystals, the single crystals having desired compositions are not capable of being obtained.

SUMMARY OF THE INVENTION

The primary object of the present invention is to provide a photo-conductor layer for constituting a radiation imaging panel, which photo-conductor layer is capable of recording radiation image information as an electrostatic latent image and contains a $Bi_xMO_y$ polycrystal capable of achieving a high sensitivity.

Another object of the present invention is to provide a radiation imaging panel comprising the photo-conductor layer.

The present invention provides a photo-conductor layer for constituting a radiation imaging panel, which photo-conductor layer is capable of recording radiation image information as an electrostatic latent image, wherein the photo-conductor layer contains a polycrystal constituted of $Bi_xMO_y$, in which M represents at least one kind of element selected from the group consisting of Ge, Si, and Ti, x represents a number satisfying the condition $12.05 \leq x \leq 13.1$, and y represents a stoichiometric oxygen atom number determined by M and x.

Ordinarily, the polycrystal is a solid constituted of an aggregate of single crystals having different orientations. The term "polycrystal" as used herein means an aggregate of single crystals having different orientations, in which the single crystals having been formed with sintering processing, aerosol deposition processing, vapor phase growing processing, or the like, have been aggregated densely and having been bonded or bound together, and in which a binder constituted of an organic material, a high-molecular weight material, or an inorganic material is not contained.

In the photo-conductor layer for constituting a radiation imaging panel in accordance with the present invention, M should preferably represents Ti.

Also, the photo-conductor layer for constituting a radiation imaging panel in accordance with the present invention should preferably be modified such that the $Bi_xMO_y$ is a sintered material. The term "sintered material" as used herein means the material having been formed with processing, in which $Bi_xMO_y$ particles are heated at their melting temperature or at a temperature such that a small amount of a liquid phase is present, and in which the bonding or the binding occurs among the constituent particles.

The present invention also provides a radiation imaging panel, comprising a photo-conductor layer, which is capable of recording radiation image information as an electrostatic latent image, wherein the photo-conductor layer contains a polycrystal constituted of $Bi_xMO_y$, in which M represents at least one kind of element selected from the group consisting of Ge, Si, and Ti, x represents a number satisfying the condition $12.05 \leq x \leq 13.1$, and y represents a stoichiometric oxygen atom number determined by M and x.

The photo-conductor layer in accordance with the present invention contains the polycrystal constituted of $Bi_xMO_y$, in which M represents at least one kind of element selected from the group consisting of Ge, Si, and Ti, x represents the number satisfying the condition $12.05 \leq x \leq 13.1$, and y represents the stoichiometric oxygen atom number determined by M and x. Therefore, with the photo-conductor layer in accordance with the present invention, the effect of collecting the generated electric charges becomes large, and the sensitivity is capable of being enhanced. Also, since the photo-conductor layer in accordance with the present invention contains the polycrystal, the photo-conductor layer having a large area is capable of being formed, and the production cost of the photo-conductor layer is capable of being kept lower than the production cost of a photo-conductor layer constituted of a $Bi_xMO_y$ single crystal.

Also, with the photo-conductor layer in accordance with the present invention, in which the particles of the photo-conductive substance are in contact with one another, the problems are capable of being prevented from occurring in that the efficiency, with which the generated electric charges are collected, becomes low due to the presence of a binder as in the cases of a photo-conductor layer having been formed with a coating technique. Further, the occurrence of electric noise is capable of being suppressed. Furthermore, graininess characteristics of an obtained image are capable of being enhanced, and a high sensitivity is capable of being obtained.

With the photo-conductor layer in accordance with the present invention, in which M represents Ti, the effect of collecting the generated electric charges is capable of being enhanced even further, and the sensitivity is capable of being enhanced even further. With the photo-conductor layer in accordance with the present invention, in which $Bi_xMO_y$ is the sintered material, the effect of collecting the generated electric charges is capable of being enhanced even further, and the sensitivity is capable of being enhanced even further.

The present invention will hereinbelow be described in further detail with reference to the accompanying drawings.

BRIEF DESCRIPTION OF THE DRAWINGS

FIG. 7 is an explanatory view showing a radiation detector and an AMA board, which are combined together, FIG. 8 is an electric circuit diagram showing an equivalent circuit of the AMA board.

DETAILED DESCRIPTION OF THE INVENTION

Figure 1:
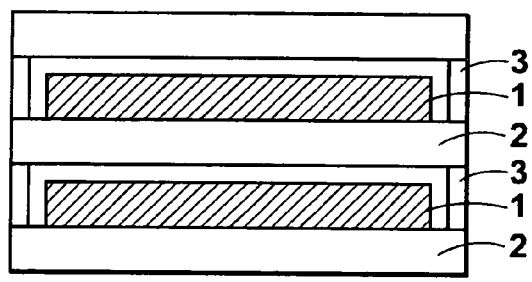
FIG. 1 is a schematic sectional view showing a process for producing a $Bi_xMO_y$ sintered material.

The photo-conductor layer in accordance with the present invention is characterized by containing the polycrystal constituted of $Bi_xMO_y$, in which M represents at least one kind of element selected from the group consisting of Ge, Si, and Ti, x represents the number satisfying the condition $12.05 \leq x \leq 13.1$, and y represents the stoichiometric oxygen atom number determined by M and x. If x in $Bi_xMO_y$ is outside the range described above, the effect of collecting the generated electric charges will become small.

The photo-conductor layer in accordance with the present invention containing the polycrystal constituted of $Bi_xMO_y$, in which M represents at least one kind of element selected from the group consisting of Ge, Si, and Ti, x represents the number satisfying the condition $12.05 \leq x \leq 13.1$, and y represents the stoichiometric oxygen atom number determined by M and x, may be produced with a process, wherein the composition ratio (the molar ratio) of Bi to M in a liquid of a raw material or particles of the raw material, which will be described later, is adjusted so as to be identical with the composition ratio of the desired $Bi_xMO_y$ crystal.

Specifically, a first process for producing the photo-conductor layer in accordance with the present invention may comprise the steps of: allowing a bismuth salt and a metal alkoxide to react with each other under an acidic condition, thereby obtaining a $Bi_xMO_y$ precursor liquid, applying the thus obtained $Bi_xMO_y$ precursor liquid onto a support, drying the thus obtained coating layer of the $Bi_xMO_y$ precursor liquid, and subjecting the resulting $Bi_xMO_y$ film or the resulting $Bi_xMO_y$ precursor film to sintering processing.

In the first process for producing the photo-conductor layer in accordance with the present invention, the bismuth salt should preferably be selected from the group consisting of bismuth nitrate or bismuth acetate. Preferable examples of the metal alkoxides include an alkoxide of Ge, an alkoxide of Si, and an alkoxide of Ti. Specifically, preferable examples of the metal alkoxides include $Ge(O-CH_3)_4$, $Ge(O-C_2H_5)_4$, $Ge(O-i-C_3H_7)_4$, $Si(O-CH_3)_4$, $Si(O-C_2H_5)_4$, $Si(O-i-C_3H_7)_4$, $Ti(O-CH_3)_4$, $Ti(O-C_2H_5)_4$, and $Ti(O-i-C_3H_7)_4$.

As a technique for subjecting the bismuth salt and the metal alkoxide to hydrolysis processing under the acidic condition, one of various known techniques maybe employed. For example, the bismuth salt and the metal alkoxide may be subjected to the hydrolysis processing together with an aqueous mixed solution of acetic acid, methoxy ethanol, and nitric acid. Alternatively, the bismuth salt and the metal alkoxide may be subjected to the hydrolysis processing together with an aqueous mixed solution of ethoxy ethanol and nitric acid. After the hydrolysis processing has been performed, the $Bi_xMO_y$ precursor liquid is obtained. Before the $Bi_xMO_y$ precursor liquid is applied onto the support, the $Bi_xMO_y$ precursor liquid should preferably be subjected to concentration processing or reflux processing.

In cases where the $Bi_xMO_y$ precursor film having been formed on the support is to be sintered, a material to be sintered (i.e., a molded material) having been obtained from the molding of the $Bi_xMO_y$ precursor film may be located on a base, which may be referred to as a setter, at the time of the sintering of the molded material. In such cases, the material for the setter should preferably be selected from oxide materials, such as an aluminum oxide sintered material, a zirconium oxide sintered material, and an aluminum oxide single crystal. In cases where the sintering is performed by use of the setter described above, the problems are capable of being prevented from occurring in that the $Bi_xMO_y$ sintered material is fused with the setter. FIG. 1 is a schematic sectional view showing a process for producing a $Bi_xMO_y$ sintered material.

FIG. 1 shows the state before the start of the sintering, in which each of materials to be sintered 1, 1 is located on one of setters 2, 2 having been formed as a rack by use of a plurality of support rods 3, 3, . . . Each of the materials to be sintered 1, 1 is a flat plate-shaped molded material of the $Bi_xMO_y$ precursor film. The setters 2, 2 should preferably be made from an oxide material, such as an aluminum oxide sintered material, a zirconium oxide sintered material, or an aluminum oxide single crystal, in which a content of silicon oxide is at most 1% by weight, more preferably at most 0.3% by weight.

The plurality of the support rods 3, 3, . . . are located at predetermined intervals in the vicinity of the periphery of each of the setters 2, 2. Each of the materials to be sintered 1, 1 is located on the corresponding setter 2 and within the space defined by the plurality of the support rods 3, 3, . . . At the time of the sintering processing, a weight plate may be located on each of the materials to be sintered 1, 1. A sintering temperature may vary in accordance with the kind of the material to be sintered, the kind of the setter, the combination of the material to be sintered and the setter, and the like. However, ordinarily, the sintering temperature should preferably fall within the range of 800° C. to 900° C. In the cases of a setter made from a platinum material, which is ordinarily utilized for the sintering processing, if the sintering processing is performed at a high temperature described above, fusing will occur between the setter and the material to be sintered, and the $Bi_xMO_y$ sintered material will not be capable of being obtained. However, each of the setters 2, 2 described above is made from the oxide material described above. Therefore, the problems are capable of being prevented from occurring in that the material to be sintered 1 and the setter 2 are fused together.

A second process for producing the photo-conductor layer in accordance with the present invention may utilize an aerosol deposition technique (an AD technique) comprising the steps of: causing $Bi_xMO_y$ particles, which have been prepared previously, to fly by a carrier gas in a vacuum, blowing the carrier gas, which contains the $Bi_xMO_y$ particles, against a support in a vacuum, and thereby depositing the $Bi_xMO_y$ particles on the support. A third process for producing the photo-conductor layer in accordance with the present invention may utilize a press sintering technique comprising the steps of: pressing $Bi_xMO_y$ particles at a high pressure by use of a pressing machine, thereby forming a film of the $Bi_xMO_y$ particles, and subjecting the thus formed film to sintering processing. A fourth process for producing the photo-conductor layer in accordance with the present invention may utilize a green sheet technique comprising the steps of: mixing $Bi_xMO_y$ particles and a binder together, subjecting the thus obtained coating composition to coating processing, thereby forming a green sheet (i.e., a film containing the binder), and subjecting the thus formed green sheet to sintering processing for removing the binder from the film and sintering the $Bi_xMO_y$ particles.

By way of example, the $Bi_xMO_y$ particles, which are to be utilized in each of the second, third, and fourth processes for producing the photo-conductor layer in accordance with the present invention, may be prepared with a technique comprising the steps of: subjecting a bismuth salt and a metal alkoxide to hydrolysis processing under an acidic condition, thereby obtaining a $Bi_xMO_y$ precursor liquid, subjecting the thus obtained $Bi_xMO_y$ precursor liquid to concentration processing, thereby obtaining a gel-like $Bi_xMO_y$ precursor, firing the thus obtained gel-like $Bi_xMO_y$ precursor, and thereby obtaining $Bi_xMO_y$ particles. Alternatively, the $Bi_xMO_y$ particles, which are to be utilized in each of the second, third, and fourth processes for producing the photo-conductor layer in accordance with the present invention, may be prepared with a solid-phase reaction technique comprising the steps of: mixing bismuth oxide ($Bi_2O_3$) and $MO_2$ (silicon oxide, germanium oxide, and/or titanium oxide) together, subjecting the resulting mixture to preliminary firing processing at a temperature of, for example, 800° C., and thereby obtaining $Bi_xMO_y$ particles.

In the cases of the green sheet technique described above, the binder is utilized. However, the binder is lost completely due to the sintering processing. Therefore, after the sintering processing has been performed, the binder does not remain in the $Bi_xMO_y$ sintered material. Preferable examples of the binders, which may be utilized for the green sheet technique, include cellulose acetate, a polyalkyl methacrylate, a polyvinyl alcohol, and a polyvinyl butyral.

Preferable examples of the bismuth salts and the metal alkoxides, which may be utilized in each of the second, third, and fourth processes for producing the photo-conductor layer in accordance with the present invention, include those described above with respect to the first process for producing the photo-conductor layer in accordance with the present invention. Also, as the technique for subjecting the bismuth salt and the metal alkoxide to the hydrolysis processing under the acidic condition, one of various known techniques described above with respect to the first process for producing the photo-conductor layer in accordance with the present invention may be employed.

The $Bi_xMO_y$ particles, which are to be utilized in the second process for producing the photo-conductor layer in accordance with the present invention, may also be prepared with a technique comprising the steps of: allowing a bismuth alkoxide and a metal alkoxide to react with each other under an alkaline condition, thereby obtaining a $Bi_xMO_y$ precursor liquid, and subjecting the thus obtained $Bi_xMO_y$ precursor liquid to crystallization processing in a liquid phase.

Preferable examples of the bismuth alkoxides described above include $Bi(O-CH_3)_3$, $Bi(O-C_2H_5)_3$, and $Bi(O-i-C_3H_7)_3$. Preferable examples of the metal alkoxides include those described above with respect to the first process for producing the photo-conductor layer in accordance with the present invention. As the technique for subjecting the bismuth alkoxide and the metal alkoxide to the hydrolysis processing under the alkaline condition, one of various known techniques may be employed. The bismuth alkoxide and the metal alkoxide should preferably be subjected to the hydrolysis processing together with sodium hydroxide, potassium hydroxide, or the like.

Figure 2:
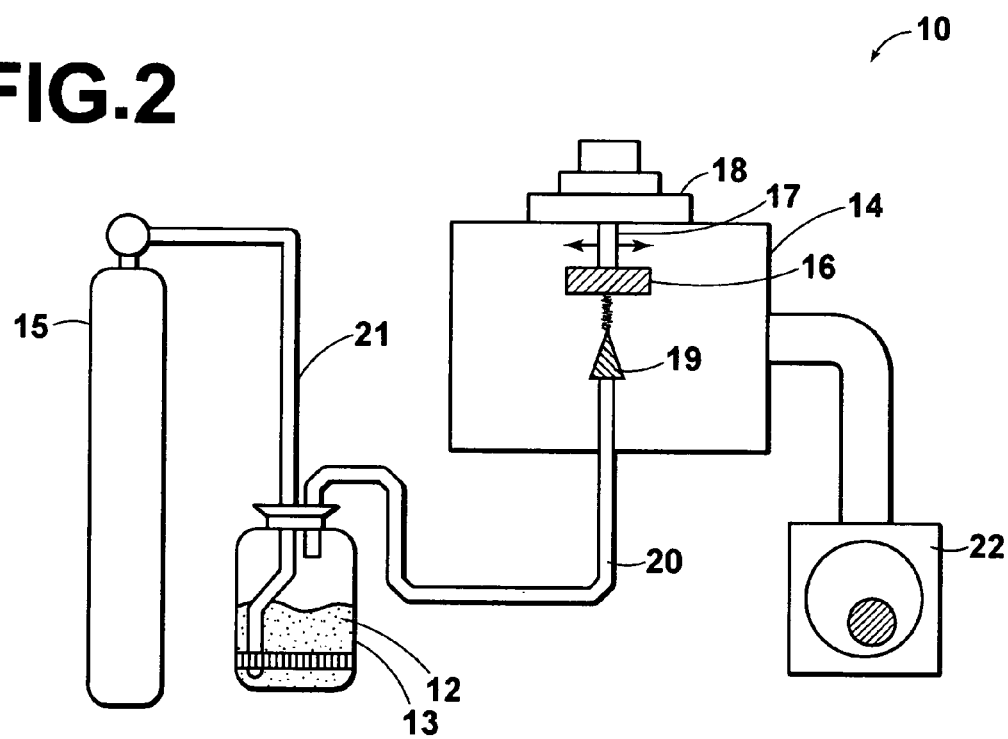
FIG. 2 is a schematic view showing a production apparatus for carrying out a process for producing a photo-conductor layer in accordance with the present invention.

With the AD technique utilized in the second process for producing the photo-conductor layer in accordance with the present invention, raw material fine particles or raw material ultrafine particles, which have been prepared previously, are mixed with a carrier gas to form an aerosol, the thus formed aerosol is jetted out through a nozzle to a base plate, and a film is thereby formed on the base plate. How the AD technique is performed will be described hereinbelow with reference to FIG. 2. FIG. 2 is a schematic view showing a film forming apparatus for carrying out the AD technique utilized for the production of the photo-conductor layer in accordance with the present invention.

With reference to FIG. 2, a production apparatus 10 comprises an aerosol forming chamber 13, in which $Bi_xMO_y$ raw material particles 12 and a carrier gas are agitated and mixed together. The production apparatus 10 also comprises a film forming chamber 14, in which film forming processing is performed. The production apparatus 10 further comprises a high-pressure gas cylinder 15, which accommodates the carrier gas. The film forming chamber 14 is provided with a base plate 16, on which the $Bi_xMO_y$ raw material particles 12 are to be deposited. The film forming chamber 14 is also provided with a holder 17 for supporting the base plate 16. The film forming chamber 14 is further provided with an XYZθ stage 18 for moving the holder 17 in three-dimensional directions. The film forming chamber 14 is still further provided with a nozzle 19 having a small opening, through which the $Bi_xMO_y$ raw material particles 12 are to be jetted out to the base plate 16. The production apparatus 10 still further comprises a first piping 20, which connects the nozzle 19 and the aerosol forming chamber 13 with each other. The production apparatus 10 also comprises a second piping 21, which connects the aerosol forming chamber 13 and the high-pressure gas cylinder 15 with each other. The production apparatus 10 further comprises a vacuum pump 22, which evacuates the region within the film forming chamber 14.

By use of the $Bi_xMO_y$ raw material particles 12, which are contained in the aerosol forming chamber 13, a film is formed on the base plate 16 with the procedure described below. Specifically, the $Bi_xMO_y$ raw material particles 12, which have particle diameters falling within the range of 0.1 μm to 2 μm and have been contained in the aerosol forming chamber 13, are subjected to vibration and agitation processing together with the carrier gas, which is introduced from the high-pressure gas cylinder 15 accommodating the carrier gas through the second piping 21 and into the aerosol forming chamber 13. In this manner, an aerosol containing the $Bi_xMO_y$ raw material particles 12 is formed in the aerosol forming chamber 13. The $Bi_xMO_y$ raw material particles 12, which are contained in the thus formed aerosol, pass through the first piping 20 and is jetted out together with the carrier gas from the nozzle 19, which has the small opening and is located in the film forming chamber 14, to the base plate 16. A film of the $Bi_xMO_y$ raw material particles 12 is thus formed on the base plate 16. The film forming chamber 14 is evacuated by the vacuum pump 22. When necessary, the degree of vacuum within the film forming chamber 14 is adjusted. Also, the holder 17, which supports the base plate 16, is capable of being moved by the XYZθ stage 18. Therefore, the $Bi_xMO_y$ film having a desired thickness is capable of being formed at a predetermined area of the base plate 16.

As the $Bi_xMO_y$ raw material particles 12, the particles having an average particle diameter falling within the range of approximately 0.1 μm to approximately 10 μm should preferably be utilized, and the particles, in which the proportion of the particles having particle diameters falling within the range of 0.1 μm to 2 μm is at least 50% by weight, should more preferably be utilized. The term "particle diameter" as used herein means the particle diameter expressed in terms of the diameter of a sphere having a volume identical with the volume of the particle. Also, the term "average particle diameter" as used herein means the number-average particle diameter.

The $Bi_xMO_y$ raw material particles 12, which are contained in the aerosol, pass through the nozzle 19 having the small opening with an opening area of at most 6 $mm^2$ and are thus easily accelerated to a flow rate falling within the range of 2 m/sec to 300 m/sec. The $Bi_xMO_y$ raw material particles 12 are thus caused by the carrier gas to impinge upon the base plate 16 and are deposited on the base plate 16. The $Bi_xMO_y$ raw material particles 12, which have been caused by the carrier gas to impinge upon the base plate 16, are bonded to one another by the impact of the impingement and thereby form the film on the base plate 16. As a result, a dense film of the $Bi_xMO_y$ raw material particles 12 is capable of being formed. At the time of the deposition of the $Bi_xMO_y$ raw material particles 12, the base plate 16 may be kept at the room temperature. However, in cases where the temperature of the base plate 16 at the time of the deposition of the $Bi_xMO_y$ raw material particles 12 is adjusted so as to fall within the range of 100° C. to 300° C., a denser film of the $Bi_xMO_y$ raw material particles 12 is capable of being formed.

The layer thickness of the photo-conductor layer in accordance with the present invention should preferably fall within the range of 10 μm to 700 μm, and should more preferably fall within the range of 80 μm to 300 μm. If the layer thickness of the photo-conductor layer is smaller than 10 μm, the X-ray absorptivity will become low, and the sensitivity will not be capable of being enhanced. If the layer thickness of the photo-conductor layer is larger than 700 μm, saturation will be reached with the X-ray absorption quantity, and the X-ray absorption quantity will not be capable of being increased even further. Also, if the layer thickness of the photo-conductor layer is larger than 700 μm, it will become necessary for the generated electric charges to move over a long distance before the generated electric charges arrive at an electrode. Therefore, in such cases, the problems will occur in that the activity of the generated electric charges is lost midway during the movement toward the electrode, and in that the efficiency, with which the generated electric charges are collected, becomes low. As a result, in such cases, an image having good image quality will not be capable of being obtained.

Ordinarily, radiation imaging panels may be classified into a direct conversion type, in which the radiation energy is directly converted into electric charges, and the thus formed electric charges are accumulated, and an indirect conversion type, in which the radiation energy is converted into light by use of a scintillator, such as CsI, the thus obtained light is then converted into electric charges by use of a-Si photodiodes, and the thus formed electric charges are accumulated. The photo-conductor layer in accordance with the present invention is employed for the direct conversion type of the radiation imaging panel. The photo-conductor layer in accordance with the present invention may be employed for the radiation, such as X-rays, γ-rays, and α-rays.

The photo-conductor layer in accordance with the present invention may be employed for an optical read-out technique, in which the read-out operation is performed by use of a radiation image detector utilizing a semiconductor material capable of generating the electric charges when being exposed to light. The photo-conductor layer in accordance with the present invention may also be employed for a TFT technique. With the TFT technique, the electric charges having been generated with the irradiation of the radiation are accumulated, and the accumulated electric charges are read through an operation, in which an electric switch, such as a thin film transistor (TFT), is turned on and off with respect to each of pixels.

Firstly, by way of example, the radiation imaging panel employed for the optical read-out technique will be described hereinbelow.

Figure 3:
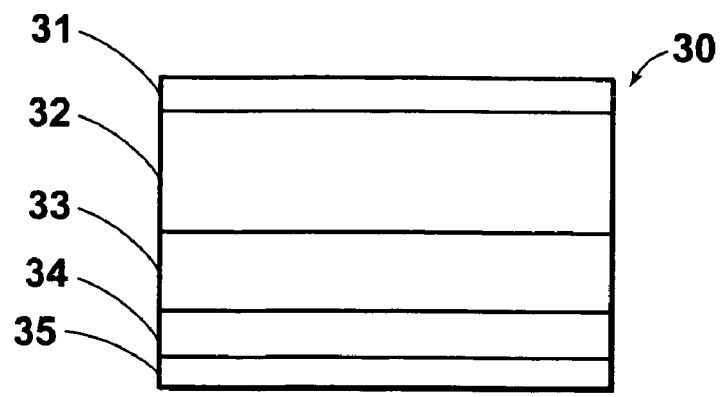
FIG. 3 is a sectional view showing an example of a radiation imaging panel, which comprises an embodiment of a photo-conductor layer in accordance with the present invention.

FIG. 3 is a sectional view showing an example of a radiation imaging panel, which comprises a photo-conductor layer in accordance with the present invention.

With reference to FIG. 3, a radiation imaging panel 30 comprises a first electrically conductive layer 31, which has transmissivity to recording radiation L1 described later. The radiation imaging panel 30 also comprises a recording radio-conductive layer 32, which exhibits electrical conductivity when it is exposed to the radiation L1 having passed through the first electrically conductive layer 31. The radiation imaging panel 30 further comprises a charge transporting layer 33, which acts approximately as an insulator with respect to electric charges (latent image polarity charges, e.g. negative charges) having a polarity identical with the polarity of electric charges occurring in the first electrically conductive layer 31, and which acts approximately as a conductor with respect to electric charges (transported polarity charges, positive charges in this example) having a polarity opposite to the polarity of the electric charges occurring in the first electrically conductive layer 31. The radiation imaging panel 30 still further comprises a reading photo-conductor layer 34, which exhibits electrical conductivity when it is exposed to reading light L2 described later, and a second electrically conductive layer 35 having transmissivity to the reading light L2. The first electrically conductive layer 31, the recording radio-conductive layer 32, the charge transporting layer 33, the reading photo-conductor layer 34, and the second electrically conductive layer 35 are overlaid in this order.

As each of the first electrically conductive layer 31 and the second electrically conductive layer 35, a film of an electrically conductive substance (tin dioxide film, or the like) uniformly coated on a transparent glass plate may be employed.

The charge transporting layer 33 may be constituted of one of various materials, which have the characteristics such that the difference between the mobility of the negative electric charges occurring in the first electrically conductive layer 31 and the mobility of the positive electric charges is large. The charge transporting layer 33 should preferably be constituted of, for example, an organic compound, such as a poly-N-vinylcarbazole (PVK), N,N'-diphenyl-N,N'-bis(3-methylphenyl)-[1,1,'-biphenyl]-4,4'-diamine (TPD), or a disk-shaped liquid crystal; or a semiconductor substance, such as a polymer (polycarbonate, polystyrene, PVK) dispersion of TPD, or a-Se doped with 10 ppm to 200 ppm of Cl. In particular, the organic compound (PVK, TPD, or the disk-shaped liquid crystal) has light insensitivity and is therefore preferable. Also, since the permittivity is ordinarily low, the capacity of the charge transporting layer 33 and the capacity of the, reading photo-conductor layer 34 become small, and the signal take-out efficiency at the time of readout is capable of being kept high.

The reading photo-conductor layer 34 should preferably be constituted of, for example, a photo-conductive material containing, as a principal constituent, at least one substance selected from the group consisting of a-Se, Se—Te, Se—As—Te, metal-free phthalocyanine, metallo-phthalocyanine, magnesium phthalocyanine (MgPc), phase II of vanadyl phthalocyanine (VoPc), and copper phthalocyanine (CuPc).

As the recording radio-conductive layer 32, the photo-conductor layer in accordance with the present invention is employed. Specifically, the photo-conductor layer in accordance with the present invention is the recording radio-conductive layer.

The optical read-out technique for reading out the electrostatic latent image will hereinbelow be described briefly.

Figure 4:
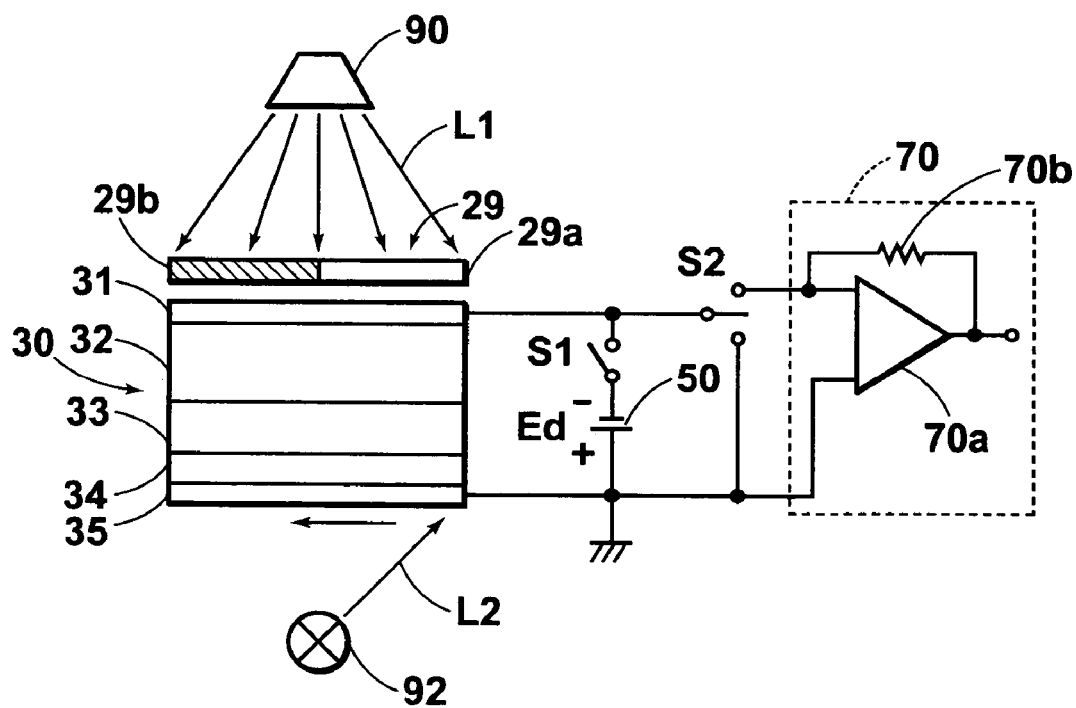
FIG. 4 is a schematic view showing a recording and read-out system, in which the radiation imaging panel of FIG. 3 is employed.

FIG. 4 is a schematic view showing a recording and read-out system (i.e., a combination of an electrostatic latent image recording apparatus and an electrostatic latent image read-out apparatus), in which the radiation imaging panel 30 of FIG. 3 is employed. With reference to FIG. 4, the recording and read-out system comprises the radiation imaging panel 30 and recording irradiation means 90. The recording and read-out system also comprises an electric power source 50 and electric current detecting means 70. The recording and read-out system further comprises read-out exposure means 92, connection means S1, and connection means S2. The electrostatic latent image recording apparatus is constituted of the radiation imaging panel 30, the electric power source 50, the recording irradiation means 90, and the connection means S1. The electrostatic latent image read-out apparatus is constituted of the radiation imaging panel 30, the electric current detecting means 70, and the connection means S2.

The first electrically conductive layer 31 of the radiation imaging panel 30 is connected via the connection means S1 to a negative pole of the electric power source 50. The first electrically conductive layer 31 of the radiation imaging panel 30 is also connected to one end of the connection means S2. One terminal of the other end of the connection means S2 is connected to the electric current detecting means 70. The second electrically conductive layer 35 of the radiation imaging panel 30, a positive pole of the electric power source 50, and the other terminal of the other end of the connection means S2 are grounded. The electric current detecting means 70 comprises a detection amplifier 70a, which is constituted of an operational amplifier, and a feedback resistor 70b. The electric current detecting means 70 thus constitutes a current-to-voltage converting circuit.

An object 29 is placed at the top surface of the first electrically conductive layer 31. The object 29 has a transmissive region 29a, which has the transmissivity to the radiation L1, and a light blocking region 29b, which does not have the transmissivity to the radiation L1. The recording irradiation means 90 uniformly irradiates the radiation L1 to the object 29. With the read-out exposure means 92, the reading light L2, such as an infrared laser beam, an LED light, or an EL light, is scanned in the direction indicated by the arrow in FIG. 4. The reading light L2 should preferably has a beam shape having been converged into a small beam diameter.

Figure 5A:
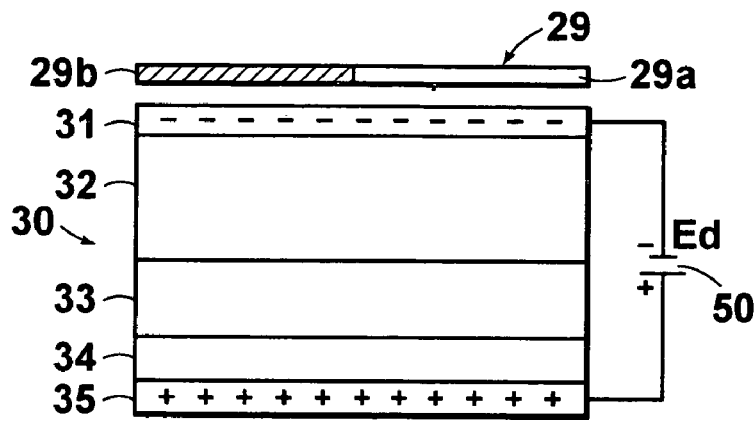
FIGS. 5A to 5D are explanatory views showing electric charge models for explanation of an electrostatic latent image recording stage in the recording and read-out system of FIG. 4, FIGS. 6A to 6D are explanatory views showing electric charge models for explanation of an electrostatic latent image read-out stage in the recording and read-out system of FIG. 4.

An electrostatic latent image recording stage in the recording and read-out system of FIG. 4 will be described hereinbelow with reference to FIGS. 5A to 5D. FIGS. 5A to 5D are explanatory views showing electric charge models for explanation of an electrostatic latent image recording stage in the recording and read-out system of FIG. 4. The connection means S2 illustrated in FIG. 4 is set in an open state (in which the connection means S2 is not connected to the ground nor to the electric current detecting means 70). Also, as illustrated in FIG. 5A, the connection means S1 illustrated in FIG. 4 is set in the on state, and a d.c. voltage Ed supplied by the electric power source 50 is applied between the first electrically conductive layer 31 and the second electrically conductive layer 35. As a result, the negative charges occur in the first electrically conductive layer 31, and the positive charges occur in the second electrically conductive layer 35. In this manner, a parallel electric field is formed between the first electrically conductive layer 31 and the second electrically conductive layer 35.

Figure 5B:
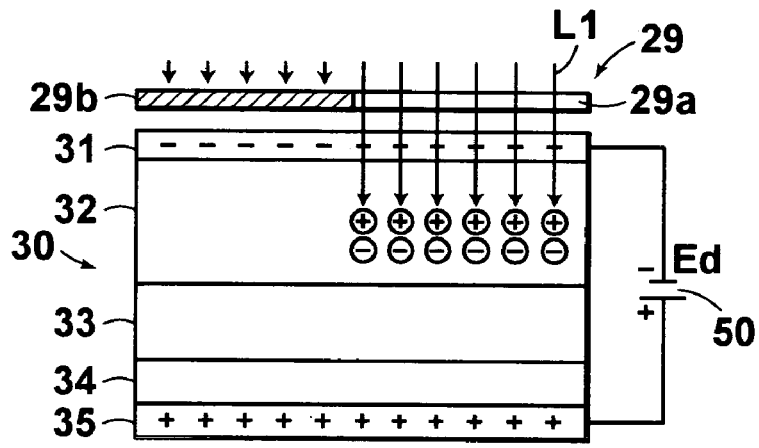

Thereafter, as illustrated in FIG. 5B, the radiation L1 is uniformly irradiated from the recording irradiation means 90 toward the object 29. The radiation L1, which has been produced by the recording irradiation means 90, passes through the transmissive region 29a of the object 29. The radiation L1 then passes through the first electrically conductive layer 31 and impinges upon the recording radio-conductive layer 32. When the recording radio-conductive layer 32 receives the radiation L1 having passed through the first electrically conductive layer 31, the recording radio-conductive layer 32 exhibits the electrical conductivity. The characteristics of the recording radio-conductive layer 32 for exhibiting the electrical conductivity are capable of being found from the characteristics in that the recording radio-conductive layer 32 acts as a variable resistor exhibiting a resistance value variable in accordance with the dose of the radiation L1. The resistance value depends upon the occurrence of electric charge pairs of electrons (negative charges) and holes (positive charges) due to the radiation L1. In cases where the dose of the radiation L1, which has passed through the object 29, is small, a large resistance value is exhibited. In FIG. 5B, the negative charges (−) formed by the radiation L1 are represented by "−" surrounded by the "○" mark, and the positive charges (+) formed by the radiation L1 are represented by "+" surrounded by the "○" mark.

Figure 5C:
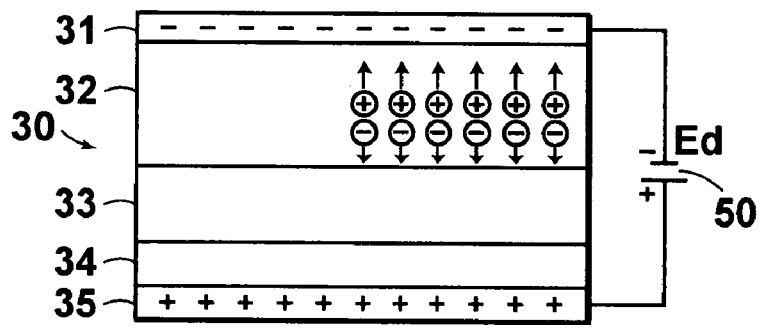
Figure 5D:
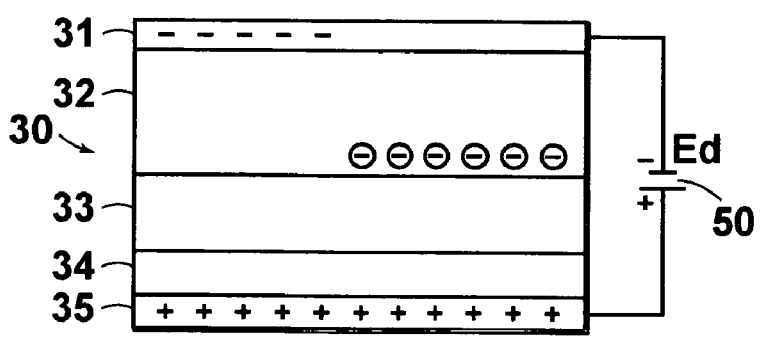

As illustrated in FIG. 5C, the positive charges, which have occurred in the recording radio-conductive layer 32, quickly migrate through the recording radio-conductive layer 32 toward the first electrically conductive layer 31. Also, as illustrated in FIG. 5D, the positive charges, which have migrated through the recording radio-conductive layer 32 toward the first electrically conductive layer 31, undergo charge re-combination with the negative charges, which have been formed in the first electrically conductive layer 31. The charge re-combination occurs at the interface between the first electrically conductive layer 31 and the recording radio-conductive layer 32, and the positive charges described above disappear.

Also, as illustrated in FIG. 5C, the negative charges, which have occurred in the recording radio-conductive layer 32, migrate through the recording radio-conductive layer 32 toward the charge transporting layer 33. The charge transporting layer 33 acts as the insulator with respect to the electric charges (in this example, the negative charges) having the polarity identical with the polarity of the electric charges occurring in the first electrically conductive layer 31. Therefore, as illustrated in FIG. 5D, the negative charges, which have migrated through the recording radio-conductive layer 32 toward the charge transporting layer 33, cease at the interface between the recording radio-conductive layer 32 and the charge transporting layer 33 and are accumulated at the interface between the recording radio-conductive layer 32 and the charge transporting layer 33. The quantity of the electric charges, which are thus accumulated, is defined by the quantity of the negative charges occurring in the recording radio-conductive layer 32, i.e. the dose of the radiation L1 having passed through the object 29.

The radiation L1 does not pass through the light blocking region 29b of the object 29. Therefore, as illustrated in FIGS. 5B, 5C, and 5D, a change does not occur at the region of the radiation imaging panel 30, which region is located under the light blocking region 29b of the object 29. In the manner described above, in cases where the radiation L1 is irradiated to the object 29, electric charges in accordance with the object image are capable of being accumulated at the interface between the recording radio-conductive layer 32 and the charge transporting layer 33. The object image, which is formed with the thus accumulated electric charges, is referred to as the electrostatic latent image.

Figure 6A:
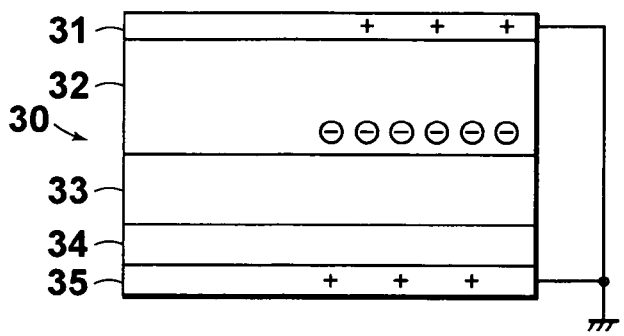

An electrostatic latent image read-out stage in the recording and read-out system of FIG. 4 will be described hereinbelow with reference to FIGS. 6A to 6D. FIGS. 6A to 6D are explanatory views showing electric charge models for explanation of an electrostatic latent image read-out stage in the recording and read-out system of FIG. 4. The connection means S1 illustrated in FIG. 4 is set in the open state, and the supply of the electric power is ceased. Also, as illustrated in FIG. 6A, the connection means S2 illustrated in FIG. 4 is connected to the ground side. In this manner, the first electrically conductive layer 31 and the second electrically conductive layer 35 of the radiation imaging panel 30, on which the electrostatic latent image has been recorded, are set at the identical electric potential, and re-arrangement of the electric charges is performed. Thereafter, the connection means S2 is connected to the side of the electric current detecting means 70.

Figure 6B:
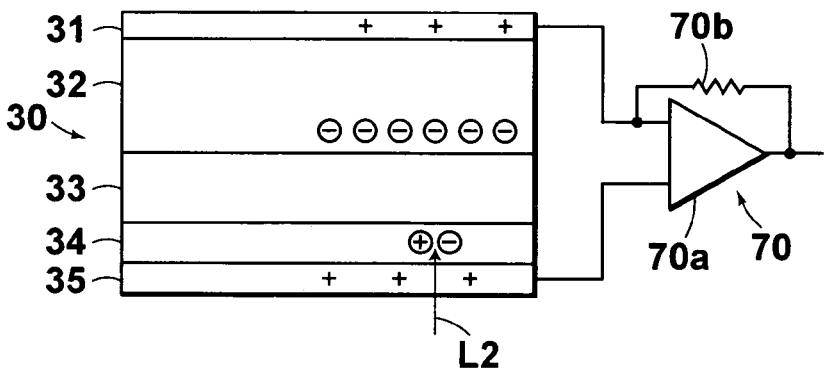

Also, as illustrated in FIG. 6B, with the read-out exposure means 92, the scanning with the reading light L2 is performed from the side of the second electrically conductive layer 35 of the radiation imaging panel 30. The reading light L2 impinging upon the second electrically conductive layer 35 passes through the second electrically conductive layer 35 and impinges upon the reading photo-conductor layer 34. When the reading photo-conductor layer 34 is exposed to the reading light L2, which has passed through the second electrically conductive layer 35, the reading photo-conductor layer 34 exhibits the electrical conductivity in accordance with the scanning exposure. As in the cases of the characteristics of the recording radio-conductive layer,32 for exhibiting the electrical conductivity due to the occurrence of the pairs of the positive and negative charges when the recording radio-conductive layer 32 is exposed to the radiation L1, the characteristics of the reading photo-conductor layer 34 for exhibiting the electrical conductivity depend upon the occurrence of the pairs of the positive and negative charges when the reading photo-conductor layer 34 is exposed to the reading light L2. As in the cases of the electrostatic latent image recording stage, in FIG. 6B, the negative charges (−) formed by the reading light L2 are represented by "−" surrounded by the "○" mark, and the positive charges (+) formed by the reading light L2 are represented by "+" surrounded by the "○" mark.

Figure 6C:
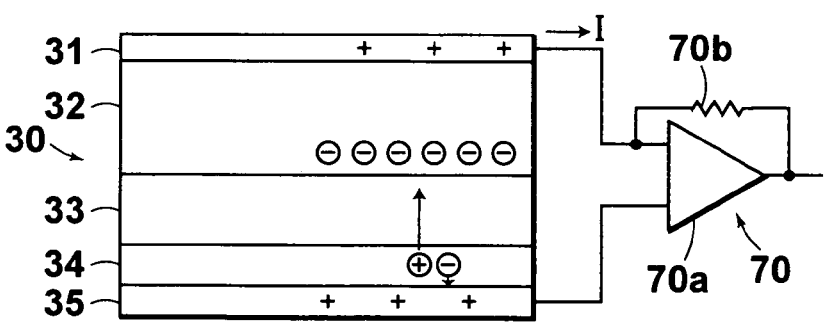
Figure 6D:
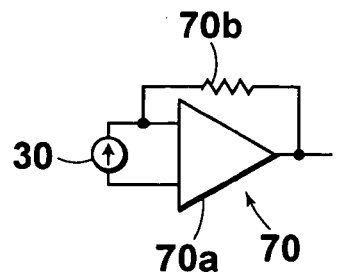

The charge transporting layer 33 acts as the electrical conductor with respect to the positive charges. Therefore, as illustrated in FIG. 6C, the positive, charges, which have occurred in the reading photo-conductor layer 34, quickly migrate through the charge transporting layer 33 by being attracted by the negative charges, which have been accumulated at the interface between the recording radio-conductive layer 32 and the charge transporting layer 33. The positive charges, which have thus migrated through the charge transporting layer 33, undergo the charge re-combination with the accumulated negative charges at the interface between the recording radio-conductive layer 32 and the charge transporting layer 33 and disappear. Also, as illustrated in FIG. 6C, the negative charges, which have occurred in the reading photoconductor layer 34, undergo the charge re-combination with the positive charges of the second electrically conductive layer 35 and disappear. The reading photo-conductor layer 34 is scanned with the reading light L2 having a sufficient optical intensity, and all of the accumulated electric charges, which have been accumulated at the interface between the recording radio-conductive layer 32 and the charge transporting layer 33, i.e. the electrostatic latent image, disappear through the charge re-combination. The disappearance of the electric charges, which have been accumulated in the radiation imaging panel 30, means the state, in which an electric current I flows across the radiation imaging panel 30 due to the migration of the electric charges. The state, in which the electric current I flows across the radiation imaging panel 30 due to the migration of the electric charges, is capable of being represented by an equivalent circuit illustrated in FIG. 6D, in which the radiation imaging panel 30 is represented by the electric current source having the electric current quantity depending upon the quantity of the accumulated electric charges.

As described above, the scanning of the radiation imaging panel 30 with the reading light L2 is performed, and the electric current flowing across the radiation imaging panel 30 is detected. In this manner, the quantity of the accumulated electric charges, which have been accumulated at each of scanned regions (corresponding to pixels), is capable of being detected. The electrostatic latent image is thus capable of being read out. The operations of the radiation detecting section are described in, for example, Japanese Unexamined Patent Publication No. 2000-105297.

The TFT type of the radiation imaging panel will be described hereinbelow. As illustrated in FIG. 7, the TFT type of the radiation imaging panel has a structure, in which a radiation detecting section 100 and an active matrix array board (AMA board) 200 has been joined together. As illustrated in FIG. 8, the radiation detecting section 100 comprises a common electrode 103 for application of a bias voltage. The radiation detecting section 100 also comprises a photo-conductor layer 104, which is sensitive to the radiation to be detected and forms carriers constituted of electron-hole pairs. The radiation detecting section 100 further comprises a detection electrode 107 for collecting the carriers. The common electrode 103, the photo-conductor layer 104, and the detection electrode 107 are overlaid in this order from the radiation incidence side. A radiation detecting section support 102 maybe located as a top layer on the common electrode 103.

The photo-conductor layer 104 is the photo-conductor layer in accordance with the present invention. Each of the common electrode 103 and the detection electrode 107 may be constituted of an electrically conductive material, such as indium tin oxide (ITO), Au, or Pt. In accordance with the polarity of the bias voltage, a hole injection blocking layer or an electron injection blocking layer maybe appended to the common electrode 103 or the detection electrode 107.

Figure 9:
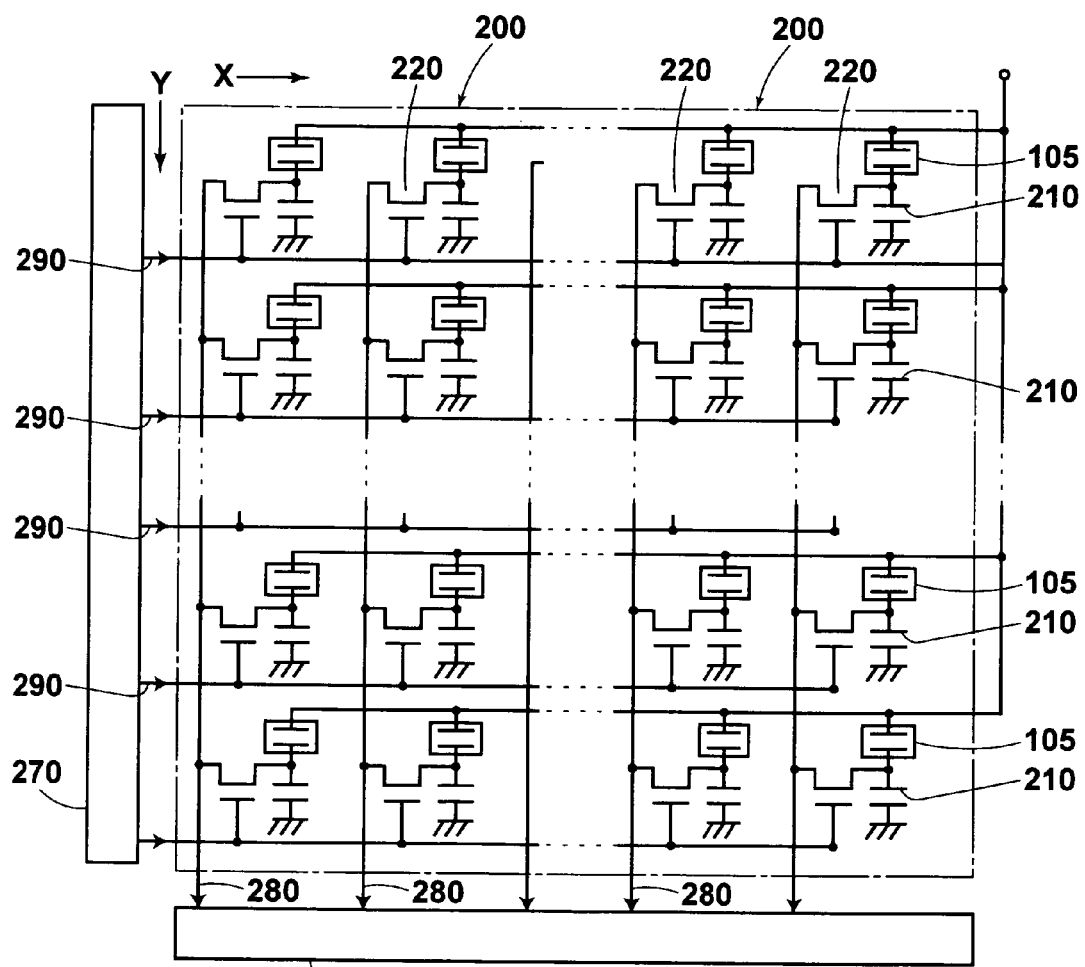
FIG. 9 is a sectional view showing a constitution at each of radiation detecting sections, each of which corresponds to one pixel.

The constitution of the AMA board 200 will hereinbelow be described briefly. As illustrated in FIG. 9, the AMA board 200 comprises capacitors 210, 210, . . . acting as charge accumulating capacitors and TFT's 220, 220, . . . acting as switching devices. One capacitor 210 and one TFT 220 are located for each of radiation detecting sections 105, 105, . . . , which correspond respectively to the pixels. On the radiation detecting section support 102, in accordance with the necessary pixels, the radiation detecting sections 105, 105, . . . corresponding to the pixels are arrayed in two-dimensional directions in a pattern of a matrix comprising approximately 1,000~3,000 rows ×1,000~3,000 columns. Also, the AMA board 200 comprises the same number of the combinations of the capacitor 210 and the TFT 220 as the number of the pixels are arrayed in two-dimensional directions in the same matrix patter as that described above. The electric charges, which have occurred in the photo-conductor layer 104, are accumulated in each of the capacitors 210, 210, . . . and act as the electrostatic latent image corresponding to the optical read-out technique. With the TFT technique, the electrostatic latent image having been formed with the radiation is kept at the charge accumulating capacitors.

The specific constitutions of each of the capacitors 210, 210, . . . and each of the TFT's 220, 220, . . . of the AMA board 200 are illustrated in FIG. 8. Specifically, an AMA board substrate 230 is constituted of an electrical insulator. A grounding side electrode 210a of the capacitor 210 and a gate electrode 220a of the TFT 220 are formed on the surface of the AMA board substrate 230. Above the grounding side electrode 210a of the capacitor 210 and the gate electrode 220a of the TFT 220, a connection side electrode 210b of the capacitor 210 is formed via an insulating film 240. Also, above the grounding side electrode 210a of the capacitor 210 and the gate electrode 220a of the TFT 220, a source electrode 220b and a drain electrode 220c of the TFT 220 are formed via the insulating film 240. Further, the top surface of the AMA board 200 is covered with a protective insulating film 250. The connection side electrode 210b of the capacitor 210 and the source electrode 220b of the TFT 220 are connected with each other and are formed together with each other. The insulating film 240 constitutes both the capacitor insulating film of the capacitor 210 and the gate insulating film of the TFT 220. The insulating film 240 may be constituted of, for example, a plasma SiN film. The AMA board 200 may be produced by use of a thin film forming technique or a fine processing technique, which is ordinarily employed for the production of a liquid crystal display board.

The joining of the radiation detecting section 100 and the AMA board 200 will be described hereinbelow. Specifically, the position of the detection electrode 107 and the position of the connection side electrode 210b of the capacitor 210 are matched with each other. In this state, the radiation detecting section 100 and the AMA board 200 are laminated together by adhesion under heating and under pressure with an anisotropic electrically conductive film (ACF) intervening therebetween. The ACF contains electrically conductive particles, such as silver particles, and has the electrical conductivity only in the thickness direction. In this manner, the radiation detecting section 100 and the AMA board 200 are mechanically combined with each other. At the same time, the detection electrode 107 and the connection side electrode 210b are electrically connected with each other by an intervening conductor section 140.

Also, the AMA board 200 is provided with a read-out actuating circuit 260 and a gate actuating circuit 270. As illustrated in FIG. 9, the read-out actuating circuit 260 is connected to each of read-out wiring lines (read-out address lines) 280, 280, . . . Each of the read-out wiring lines 280, 280, . . . extends in the vertical (Y) direction and connects the drain electrodes 220c, 220c, . . . of the TFT's 220, 220, . . . , which are arrayed along an identical column. The gate actuating circuit 270 is connected to each of read-out wiring lines (gate address lines) 290, 290, . . . Each of the read-out wiring lines 290, 290, ... extends in the horizontal (X) direction and connects the gate electrodes 220a, 220a, ... of the TFT's 220, 220, ..., which are arrayed along an identical row. Though not shown, in the read-out actuating circuit 260, one pre-amplifier (one electric charge-to-voltage converter) is connected to each of the read-out wiring lines 280, 280, ... In this manner, the AMA board 200 is connected to the read-out actuating circuit 260 and the gate actuating circuit 270. Alternatively, the read-out actuating circuit 260 and the gate actuating circuit 270 may be formed into an integral body within the AMA board 200.

The radiation detecting operations performed by the radiation image recording and read-out system, which comprises the radiation detecting section 100 and the AMA board 200 joined together, are described in, for example, Japanese Unexamined Patent Publication No. 11(1999)-287862.

The present invention will further be illustrated by the following non-limitative examples.

EXAMPLES

Example 1

Bismuth oxide ($Bi_2O_3$) particles and titanium oxide ($TiO_2$) particles were mixed together such that a ratio of Bi:Ti might become equal to Bi:Ti=12.1:1. The resulting mixture was then subjected to ball mill mixing processing in ethanol by use of zirconium oxide balls. The mixture having been subjected to the ball mill mixing processing was recovered and dried. Thereafter, the mixture was subjected to preliminary firing processing at a temperature of 800° C. for eight hours. In this manner, $Bi_{12.1}TiO_{20.15}$ particles were obtained from the solid phase reaction of bismuth oxide and titanium oxide. The thus obtained $Bi_{12.1}TiO_{20.15}$ particles were then coarsely ground by use of a mortar, and the particles having a particle diameter of at most 150 μm were thus obtained. The $Bi_{12.1}TiO_{20.15}$ particles having thus been obtained were then subjected to grinding and dispersing processing in ethanol with a ball mill by use of zirconium oxide balls. At the time of the grinding and dispersing processing, 0.4 wt % of a polyvinyl butyral (PVB) was added as a dispersing agent for promoting the dispersing. Thereafter, 3.7 wt % of polyvinyl butyral acting as a binder and 0.8 wt % of dioctyl phthalate acting as a plasticizer were added, and the resulting mixture was further subjected to the grinding and dispersing processing with the ball mill. In this manner, a slurry for sheet formation was prepared. After the mixing with the ball mill had been performed, the recovered slurry was defoamed and concentrated with a vacuum defoaming process, and the viscosity of the slurry was adjusted.

The slurry having the adjusted viscosity was coated with a coater onto a film base, to which a releasing agent had been applied. The slurry was thus molded into a sheet shape. The resulting molded material was left to stand at the room temperature for 24 hours and dried. The molded material was then separated from the film base. The molded sheet material having been separated from the film base was located on a sapphire single crystal and subjected to sintering processing in an Ar atmosphere at a sintering temperature of 820° C. In this manner, a $Bi_{12.1}TiO_{20.15}$ sintered material was obtained. Approximately 0.3 g of the thus obtained sintered material was subjected to heat decomposition processing with nitric acid and sulfuric acid. Also, the material having been obtained from the heat decomposition processing was dissolved with dilute nitric acid, and the resulting solution was made up to a constant volume. After the thus obtained solution was diluted with dilute nitric acid when necessary, the Bi:Ti composition ratio was measured two times with a radio-frequency induction coupling plasma (ICP) emission spectroscopic analysis technique (by use of a sequential type of ICP emission spectroscopic analysis apparatus, supplied by Seiko Instruments Co.). The two times of the measurements revealed that Bi:Ti=12.1:1.

Example 2

A $Bi_{12.4}TiO_{20.6}$ sintered material was prepared in the same manner as that in Example 1, except that the bismuth oxide ($Bi_2O_3$) particles and the titanium oxide ($TiO_2$) particles were mixed together such that the ratio of Bi:Ti might become equal to Bi:Ti=12.4:1. Also, the Bi:Ti composition ratio in the sintered material was measured two times in the same manner as that in Example 1. The two times of the measurements revealed that Bi:Ti=12.4:1.

Example 3

A $Bi_{12.8}TiO_{21.2}$ sintered material was prepared in the same manner as that in Example 1, except that the bismuth oxide ($Bi_2O_3$) particles and the titanium oxide ($TiO_2$) particles were mixed together such that the ratio of Bi:Ti might become equal to Bi:Ti=12.8:1. Also, the Bi:Ti composition ratio in the sintered material was measured two times in the same manner as that in Example 1. The two times of the measurements revealed that Bi:Ti=12.8:1.

Example 4

A $Bi_{13.1}TiO_{21.65}$ sintered material was prepared in the same manner as that in Example 1, except that the bismuth oxide ($Bi_2O_3$) particles and the titanium oxide ($TiO_2$) particles were mixed together such that the ratio of Bi:Ti might become equal to Bi:Ti=13.1:1. Also, the Bi:Ti composition ratio in the sintered material was measured two times in the same manner as that in Example 1. The two times of the measurements revealed that Bi:Ti=13.1:1.

Example 5

A $Bi_{12.1}SiO_{20.15}$ sintered material was prepared in the same manner as that in Example 1, except that the bismuth oxide ($Bi_2O_3$) particles and silicon oxide ($SiO_2$) particles were mixed together such that the ratio of Bi:Si might become equal to Bi:Si=12.1:1. Approximately 0.1 g of the thus obtained sintered material was subjected to heat decomposition processing with nitric acid. Also, deionized water was added to the material having been obtained from the heat decomposition processing, and the resulting mixture was subjected to filtration. (The thus obtained filtrate was made up to a constant volume.) At this time, insolubles were melted with sodium carbonate and dissolved with dilute nitric acid. The resulting solution was made up to a constant volume. After the thus obtained solution was diluted with dilute nitric acid when necessary, the Bi:Si composition ratio was measured two times by use of the same ICP emission spectroscopic analysis apparatus as that utilized in Example 1. The two times of the measurements revealed that Bi:Si=12.1:1.

Example 6

A $Bi_{12.4}SiO_{20.6}$ sintered material was prepared in the same manner as that in Example 1, except that the bismuth oxide ($Bi_2O_3$) particles and silicon oxide ($SiO_2$) particles were mixed together such that the ratio of Bi:Si might become equal to Bi:Si=12.4:1. Also, the Bi:Si composition ratio in the sintered material was measured two times in the same manner as that in Example 5. The two times of the measurements revealed that Bi:Si=12.4:1.

Example 7

A $Bi_{12.8}SiO_{21.2}$ sintered material was prepared in the same manner as that in Example 1, except that the bismuth oxide ($Bi_2O_3$) particles and silicon oxide ($SiO_2$) particles were mixed together such that the ratio of Bi:Si might become equal to Bi:Si=12.8:1. Also, the Bi:Si composition ratio in the sintered material was measured two times in the same manner as that in Example 5. The two times of the measurements revealed that Bi:Si=12.8:1.

Example 8

A $Bi_{13.1}SiO_{21.65}$ sintered material was prepared in the same manner as that in Example 1, except that the bismuth oxide ($Bi_2O_3$) particles and silicon oxide ($SiO_2$) particles were mixed together such that the ratio of Bi:Si might become equal to Bi:Si=13.1:1. Also, the Bi:Si composition ratio in the sintered material was measured two times in the same manner as that in Example 5. The two times of the measurements revealed that Bi:Si=13.1:1.

Example 9

A $Bi_{12.1}GeO_{20.15}$ sintered material was prepared in the same manner as that in Example 1, except that the bismuth oxide ($Bi_2O_3$) particles and germanium oxide ($GeO_2$) particles were mixed together such that the ratio of Bi:Ge might become equal to Bi:Ge=12.1:1. Also, the Bi:Ge composition ratio in the sintered material was measured two times in the same manner as that in Example 5. The two times of the measurements revealed that Bi:Ge=12.1:1.

Example 10

A $Bi_{12.4}GeO_{20.6}$ sintered material was prepared in the same manner as that in Example 1, except that the bismuth oxide ($Bi_2O_3$) particles and germanium oxide ($GeO_2$) particles were mixed together such that the ratio of Bi:Ge might become equal to Bi:Ge=12.4:1. Also, the Bi:Ge composition ratio in the sintered material was measured two times in the same manner as that in Example 5. The two times of the measurements revealed that Bi:Ge=12.4:1.

Example 11

A $Bi_{12.8}GeO_{21.2}$ sintered material was prepared in the same manner as that in Example 1, except that the bismuth oxide ($Bi_2O_3$) particles and germanium oxide ($GeO_2$) particles were mixed together such that the ratio of Bi:Ge might become equal to Bi:Ge=12.8:1. Also, the Bi:Ge composition ratio in the sintered material was measured two times in the same manner as that in Example 5. The two times of the measurements revealed that Bi:Ge=12.8:1.

Example 12

A $Bi_{13.1}GeO_{20.65}$ sintered material was prepared in the same manner as that in Example 1, except that the bismuth oxide ($Bi_2O_3$) particles and germanium oxide ($GeO_2$) particles were mixed together such that the ratio of Bi:Ge might become equal to Bi:Ge=13.1:1. Also, the Bi:Ge composition ratio in the sintered material was measured two times in the same manner as that in Example 5. The two times of the measurements revealed that Bi:Ge=13.1:1.

Comparative Example 1

A $Bi_{12}TiO_{20}$ sintered material was prepared in the same manner as that in Example 1, except that the bismuth oxide ($Bi_2O_3$) particles and the titanium oxide ($TiO_2$) particles were mixed together such that the ratio of Bi:Ti might become equal to Bi:Ti=12.0:1. Also, the Bi:Ti composition ratio in the sintered material was measured two times in the same manner as that in Example 1. The two times of the measurements revealed that Bi:Ti=12.0:1.

Comparative Example 2

A $Bi_{13.2}TiO_{21.8}$ sintered material was prepared in the same manner as that in Example 1, except that the bismuth oxide ($Bi_2O_3$) particles and the titanium oxide ($TiO_2$) particles were mixed together such that the ratio of Bi:Ti might become equal to Bi:Ti=13.2:1. Also, the Bi:Ti composition ratio in the sintered material was measured two times in the same manner as that in Example 1. The two times of the measurements revealed that Bi:Ti=13.2:1.

Comparative Example 3

A $Bi_{12}SiO_{20}$ sintered material was prepared in the same manner as that in Example 1, except that the bismuth oxide ($Bi_2O_3$) particles and silicon oxide ($SiO_2$) particles were mixed together such that the ratio of Bi:Si might become equal to Bi:Si=12.0:1. Also, the Bi:Si composition ratio in the sintered material was measured two times in the same manner as that in Example 5. The two times of the measurements revealed that Bi:Si=12.0:1.

Comparative Example 4

A $Bi_{13.2}SiO_{21.8}$ sintered material was prepared in the same manner as that in Example 1, except that the bismuth oxide ($Bi_2O_3$) particles and silicon oxide ($SiO_2$) particles were mixed together such that the ratio of Bi:Si might become equal to Bi:Si=13.2:1. Also, the Bi:Si composition ratio in the sintered material was measured two times in the same manner as that in Example 5. The two times of the measurements revealed that Bi:Si=13.2:1.

Comparative Example 5

A $Bi_{12}GeO_{20}$ sintered material was prepared in the same manner as that in Example 1, except that the bismuth oxide ($Bi_2O_3$) particles and germanium oxide ($GeO_2$) particles were mixed together such that the ratio of Bi:Ge might become equal to Bi:Ge=12.0:1. Also, the Bi:Ge composition ratio in the sintered material was measured two times in the same manner as that in Example 5. The two times of the measurements revealed that Bi:Ge=12.0:1.

Comparative Example 6

A $Bi_{13.2}GeO_{21.8}$ sintered material was prepared in the same manner as that in Example 1, except that the bismuth oxide ($Bi_2O_3$) particles and germanium oxide ($GeO_2$) particles were mixed together such that the ratio of Bi:Ge might become equal to Bi:Ge=13.2:1. Also, the Bi:Ge composition ratio in the sintered material was measured two times in the same manner as that in Example 5. The two times of the measurements revealed that Bi:Ge=13.2:1.

With respect to each of the sintered materials, which had been obtained in Examples 1 to 12 and Comparative Examples 1 to 6, Au electrodes were formed on opposite sides of the sintered material with a sputtering technique, and a detecting section of the radiation imaging panel provided with the photo-conductor layer was thereby formed. Also, after a voltage of 500V had been applied across the two electrodes, 10 mR X-rays (produced by a tungsten tube, under the condition of a voltage of 80 kV) were irradiated to the radiation imaging panel for 0.1 second. A photo-current flowing across the two electrodes at this time was converted into a voltage by use of a current amplifier, and the voltage was measured with a digital oscilloscope. In accordance with the obtained current-time curve, integration was made within the range of the X-ray irradiation time, and the quantity of the generated electric charges per sample area was calculated.

The results shown in Table 1 below were obtained. The generated electric charge quantity was represented as a relative value with respect to the generated electric charge quantity of the corresponding $Bi_{12}MO_{20}$ sintered material, which generated electric charge quantity was taken as 1.0, and as a relative value with respect to the generated electric charge quantity of the $Bi_{12}TiO_{20}$ sintered material, which generated electric charge quantity was taken as 1.0. (Specifically, the generated electric charge quantity was represented as a relative value with respect to the generated electric charge quantity of the sintered material specified in the parenthesis in Table 1, which generated electric charge quantity was taken as 1.0.)

TABLE 1

| | | X | X-ray photo-conductivity (relative value) | |
|---|---|---|---|---|
| | Composition | (measured value) | Each $Bi_{12}MO_{20}$: taken as 1.0 | $Bi_{12}TiO_{20}$: taken as 1.0 |
| Example 1 | $Bi_xTiO_y$ | 12.1 | 1.3 (Comp. Ex. 1: 1.0) | 1.3 (Comp. Ex. 1: 1.0) |
| Example 2 | $Bi_xTiO_y$ | 12.4 | 1.8 (Comp. Ex. 1: 1.0) | 1.8 (Comp. Ex. 1: 1.0) |
| Example 3 | $Bi_xTiO_y$ | 12.8 | 1.7 (Comp. Ex. 1: 1.0) | 1.7 (Comp. Ex. 1: 1.0) |
| Example 4 | $Bi_xTiO_y$ | 13.1 | 1.1 (Comp. Ex. 1: 1.0) | 1.1 (Comp. Ex. 1: 1.0) |
| Example 5 | $Bi_xSiO_y$ | 12.1 | 1.2 (Comp. Ex. 3: 1.0) | 0.8 (Comp. Ex. 1: 1.0) |
| Example 6 | $Bi_xSiO_y$ | 12.4 | 1.5 (Comp. Ex. 3: 1.0) | 1.1 (Comp. Ex. 1: 1.0) |
| Example 7 | $Bi_xSiO_y$ | 12.8 | 1.4 (Comp. Ex. 3: 1.0) | 1.0 (Comp. Ex. 1: 1.0) |
| Example 8 | $Bi_xSiO_y$ | 13.1 | 1.1 (Comp. Ex. 3: 1.0) | 0.8 (Comp. Ex. 1: 1.0) |
| Example 9 | $Bi_xGeO_y$ | 12.1 | 1.2 (Comp. Ex. 5: 1.0) | 1.0 (Comp. Ex. 1: 1.0) |
| Example 10 | $Bi_xGeO_y$ | 12.4 | 1.6 (Comp. Ex. 5: 1.0) | 1.3 (Comp. Ex. 1: 1.0) |
| Example 11 | $Bi_xGeO_y$ | 12.8 | 1.5 (Comp. Ex. 5: 1.0) | 1.2 (Comp. Ex. 1: 1.0) |

TABLE 1-continued

| | | X | X-ray photo-conductivity (relative value) | |
|---|---|---|---|---|
| | Composition | (measured value) | Each $Bi_{12}MO_{20}$: taken as 1.0 | $Bi_{12}TiO_{20}$: taken as 1.0 |
| Example 12 | $Bi_xGeO_y$ | 13.1 | 1.1 (Comp. Ex. 5: 1.0) | 0.9 (Comp. Ex. 1: 1.0) |
| Comp. Ex. 1 | $Bi_xTiO_y$ | 12.0 | 1.0 | 1.0 |
| Comp. Ex. 2 | $Bi_xTiO_y$ | 13.2 | 0.8 (Comp. Ex. 1: 1.0) | 0.8 (Comp. Ex. 1: 1.0) |
| Comp. Ex. 3 | $Bi_xSiO_y$ | 12.0 | 1.0 | 0.7 (Comp. Ex. 1: 1.0) |
| Comp. Ex. 4 | $Bi_xSiO_y$ | 13.2 | 0.6 (Comp. Ex. 3: 1.0) | 0.4 (Comp. Ex. 1: 1.0) |
| Comp. Ex. 5 | $Bi_xGeO_y$ | 12.0 | 1.0 | 0.8 (Comp. Ex. 1: 1.0) |
| Comp. Ex. 6 | $Bi_xGeO_y$ | 13.2 | 0.7 (Comp. Ex. 5: 1.0) | 0.6 (Comp. Ex. 1: 1.0) |

As clear from Table 1, the photo-conductor layer containing $Bi_xMO_y$ in accordance with the present invention exhibited the generated electric charge quantity 1.1 to 1.8 times as large as the generated electric charge quantity of the photo-conductor layer containing the corresponding $Bi_{12}MO_{20}$. Particularly, the photo-conductor layer containing $Bi_xMO_y$, in which M represents Ti, in accordance with the present invention exhibited the generated electric charge quantity 1.6 times, on the average, as large as the generated electric charge quantity of the photo-conductor layer containing $Bi_{12}MO_{20}$, in which M represents Ti.

As described above, the photo-conductor layer in accordance with the present invention contains the polycrystal constituted of $Bi_xMO_y$, in which M represents at least one kind of element selected from the group consisting of Ge, Si, and Ti, x represents the number satisfying the condition $12.05 \leq x \leq 13.1$, and y represents the stoichiometric oxygen atom number determined by M and x. Therefore, with the photo-conductor layer in accordance with the present invention, the effect of collecting the generated electric charges becomes large, and the sensitivity is capable of being enhanced. Also, since the photo-conductor layer in accordance with the present invention contains the polycrystal, the photo-conductor layer having a large area is capable of being formed. Further, with the photo-conductor layer in accordance with the present invention, the problems are capable of being prevented from occurring in that the efficiency, with which the generated electric charges are collected, becomes low due to the presence of a binder as in the cases of a photo-conductor layer having been formed with a coating technique. Furthermore, the occurrence of electric noise is capable of being suppressed. Also, graininess characteristics of the obtained image are capable of being enhanced, and a high sensitivity is capable of being obtained.

What is claimed is:

1. A photo-conductor layer for constituting a radiation imaging panel, which photo-conductor layer is capable of recording radiation image information as an electrostatic latent image, wherein the photo-conductor layer contains a polycrystal constituted of $Bi_xMO_y$, in which M represents at least one kind of element selected from the group consisting of Ge, Si, and Ti, x represents a number satisfying the condition $12.05 \leqq x \leqq 13.1$, and y represents a stoichiometric oxygen atom number determined by M and x.

2. A photo-conductor layer for constituting a radiation imaging panel as defined in claim 1, wherein M represents Ti.

3. A photo-conductor layer for constituting a radiation imaging panel as defined in claim 1, wherein the $Bi_xMO_y$ is a sintered material.

4. A photo-conductor layer for constituting a radiation imaging panel as defined in claim 2, wherein the $Bi_xMO_y$ is a sintered material.

5. A radiation imaging panel, comprising a photo-conductor layer containing a polycrystal constituted of $Bi_xMO_y$ as defined in claim 1, the photo-conductor layer being capable of recording radiation image information as an electrostatic latent image.

6. A radiation imaging panel, comprising a photo-conductor layer containing a polycrystal constituted of $Bi_xMO_y$ as defined in claim 2, the photo-conductor layer being capable of recording radiation image information as an electrostatic latent image.

7. A radiation imaging panel, comprising a photo-conductor layer containing a polycrystal constituted of $Bi_xMO_y$ as defined in claim 3, the photo-conductor layer being capable of recording radiation image information as an electrostatic latent image.

8. A radiation imaging panel, comprising a photo-conductor layer containing a polycrystal constituted of $Bi_xMO_y$ as defined in claim 4, the photo-conductor layer being capable of recording radiation image information as an electrostatic latent image.

* * * * *